US011201690B2

(12) United States Patent
Neal

(10) Patent No.: US 11,201,690 B2
(45) Date of Patent: *Dec. 14, 2021

(54) FORWARD ERROR CORRECTION WITH OPTICAL AND ELECTRICAL TRANSPONDER

(71) Applicant: VIAVI SOLUTIONS INC., San Jose, CA (US)

(72) Inventor: Andrew Neal, New Market, MD (US)

(73) Assignee: VIAVI SOLUTIONS INC., San Jose, CA (US)

( * ) Notice: Subject to any disclaimer, the term of this patent is extended or adjusted under 35 U.S.C. 154(b) by 94 days.

This patent is subject to a terminal disclaimer.

(21) Appl. No.: 16/596,296

(22) Filed: Oct. 8, 2019

(65) Prior Publication Data
US 2020/0044771 A1 Feb. 6, 2020

Related U.S. Application Data

(63) Continuation of application No. 15/260,702, filed on Sep. 9, 2016, now Pat. No. 10,469,199.

(51) Int. Cl.
*H04L 1/24* (2006.01)
*H04L 1/00* (2006.01)
*H03M 13/15* (2006.01)
*H04B 10/40* (2013.01)

(52) U.S. Cl.
CPC ...... *H04L 1/0041* (2013.01); *H03M 13/1515* (2013.01); *H04B 10/40* (2013.01); *H04L 1/0057* (2013.01); *H04L 1/243* (2013.01); *H04L 1/244* (2013.01)

(58) Field of Classification Search
CPC ..... H04L 1/0041; H04L 1/0057; H04L 1/243; H04L 1/244; H04B 10/40; H03M 13/1515
USPC .................................. 714/770, 700
See application file for complete search history.

(56) References Cited

U.S. PATENT DOCUMENTS

| | | | |
|---|---|---|---|
| 6,704,890 B1* | 3/2004 | Carotti | H04L 25/14 714/700 |
| 2004/0216014 A1* | 10/2004 | Okayasu | H03K 5/14 714/700 |
| 2005/0063456 A1 | 3/2005 | McIntire | |
| 2005/0081128 A1* | 4/2005 | Jones | H03M 13/6583 714/700 |
| 2006/0269294 A1* | 11/2006 | Kikuchi | H04B 10/5561 398/161 |
| 2007/0082696 A1 | 4/2007 | Wang | |
| 2008/0201599 A1* | 8/2008 | Ferraiolo | H04L 7/0037 713/401 |
| 2009/0100314 A1* | 4/2009 | Danninger | H03M 13/2732 714/755 |
| 2009/0110033 A1* | 4/2009 | Shattil | H04J 13/0077 375/141 |

(Continued)

*Primary Examiner* — Albert Decady
*Assistant Examiner* — Enam Ahmed
(74) *Attorney, Agent, or Firm* — Mannava & Kang, P.C.

(57) ABSTRACT

A test instrument or host device can apply inverse transmitter and receiver functions to data transmitted or received by an electrical and optical transponder. The inverse transmitter and receiver functions are applied to counteract internal signal conversion processes of the transponder. Forward error correction and test pattern analysis may be performed on signals received from the transponder after the inverse receiver function is applied to the received signals.

20 Claims, 10 Drawing Sheets

(56) References Cited

U.S. PATENT DOCUMENTS

| | | |
|---|---|---|
| 2009/0141843 A1 | 6/2009 | Bruennert |
| 2010/0158518 A1* | 6/2010 | Shin ........................ H04L 25/14 |
| | | 398/45 |
| 2013/0283108 A1 | 10/2013 | Kono |
| 2015/0229438 A1 | 8/2015 | Le Taillandier De Gabory |
| 2018/0343151 A1* | 11/2018 | Tiruvur ................... H04L 27/04 |

* cited by examiner

Dealy and Scambling of Rx Function

701 → $\begin{matrix} c0 \\ c1 \\ c2 \\ c3 \\ c4 \end{matrix}$ × 702 → P permutation matrix $\begin{bmatrix} 0 & 0 & 1 & 0 & 0 \\ 1 & 0 & 0 & 0 & 0 \\ 0 & 0 & 0 & 0 & 1 \\ 0 & 1 & 0 & 0 & 0 \\ 0 & 0 & 0 & 1 & 0 \end{bmatrix}$ = 703 → $\begin{matrix} c2 \\ c0 \\ c1 \\ c3 \\ c4 \end{matrix}$ $\begin{matrix} c2 \\ c0 \\ c1 \\ c3 \\ c4 \end{matrix}$ × 704 → Z delay matrix $\begin{bmatrix} Z^0 & 0 & 0 & 0 & 0 \\ 0 & Z^2 & 0 & 0 & 0 \\ 0 & 0 & Z^0 & 0 & 0 \\ 0 & 0 & 0 & Z^{16} & 0 \\ 0 & 0 & 0 & 0 & Z^{-4} \end{bmatrix}$ = 705 → $\begin{matrix} c2\,Z^0 \\ c0\,Z^2 \\ c1\,Z^0 \\ c3\,Z^{16} \\ c4\,Z^{-4} \end{matrix}$ parallel multiplexed data sent from transponder to test instrument 706 → $\begin{matrix} c2\,Z^0 \\ c0\,Z^2 \\ c1\,Z^0 \\ c3\,Z^{16} \\ c4\,Z^{-4} \end{matrix}$ × 707 → Z$^{-1}$ $\begin{bmatrix} Z^0 & 0 & 0 & 0 & 0 \\ 0 & Z^{-2} & 0 & 0 & 0 \\ 0 & 0 & Z^0 & 0 & 0 \\ 0 & 0 & 0 & Z^{-16} & 0 \\ 0 & 0 & 0 & 0 & Z^4 \end{bmatrix}$ = 708 → $\begin{matrix} c2\,Z^0 \\ c0\,Z^0 \\ c1\,Z^0 \\ c3\,Z^0 \\ c4\,Z^0 \end{matrix}$ $\begin{matrix} c2\,Z^0 \\ c0\,Z^0 \\ c1\,Z^0 \\ c3\,Z^0 \\ c4\,Z^0 \end{matrix}$ × 709 → P$^{-1}$ $\begin{bmatrix} 0 & 1 & 0 & 0 & 0 \\ 0 & 0 & 0 & 1 & 0 \\ 1 & 0 & 0 & 0 & 0 \\ 0 & 0 & 0 & 0 & 1 \\ 0 & 0 & 1 & 0 & 0 \end{bmatrix}$ = 710 → $\begin{matrix} c0\,Z^0 \\ c1\,Z^0 \\ c2\,Z^0 \\ c3\,Z^0 \\ c4\,Z^0 \end{matrix}$ Dealy and Scambling of Rx$^{-1}$ Function

FIG. 7

FORWARD ERROR CORRECTION WITH OPTICAL AND ELECTRICAL TRANSPONDER

PRIORITY

This application is a Continuation of commonly assigned and co-pending U.S. patent application Ser. No. 15/260,702, filed Sep. 9, 2016, the disclosure of which is hereby incorporated by reference in its entirety.

BACKGROUND

In telecommunications, forward error correction (FEC) is commonly used to detect and correct errors caused by transmission over communication channels. Generally for FEC, a function is used to redundantly encode data to be transmitted over a communication channel. Reed-Solomon (RS) codes are commonly used error correcting codes used in FEC that are generated based on univariate polynomials over finite fields. The redundantly encoded data of the FEC allows the receiver to detect errors in the received data and correct these errors without retransmission.

In optical fiber communications, a transponder is the element that sends and receives the optical signal to/from fiber optic lines. A transponder may be characterized by its data rate and the maximum distance the signal can travel. The transponder may be connected between an electrical telecommunication system and an optical telecommunications system, and includes a host interface connected to the electrical telecommunication system and a line interface connected to the optical telecommunications system.

These type of optoelectrical transponders include multiplexing/de-multiplexing and encoding to convert data received from the lower speed lanes of the host interface to higher speed lanes of the optical interface. An example is a 100 gigabit per second (Gbps) transponder with a host interface including ten electrically encoded 10 Gbps lanes and a line interface including four 25 Gbps optically encoded wavelength lanes.

To use FEC with these transponders, the FEC codes should be applied directly to the line interface so the FEC codes do not get scrambled by the multiplexing and the transmission delay caused by the transponder converting data received from the lower speed lanes of the host interface for transmission on the higher speed lanes of the optical interface. However, the host transmitting data with FEC codes does not have direct access to the line interface of the transponder. Thus, when the host sends data, including FEC codes, to the transponder for transmission over the optical network at high speeds to a destination, the transponder scrambles the FEC codes, which renders them useless for error correction at the receiver. Thus, FEC typically is not used with these type of transponders, and receivers cannot rely on FEC codes for error correction.

BRIEF DESCRIPTION OF THE DRAWINGS

Features of the present disclosure are illustrated by way of examples shown in the following figures. In the following figures, like numerals indicate like elements, in which:

FIGS. 6-8 show an example of transmitter side and receiver side operations, according to an example of the present disclosure;

DETAILED DESCRIPTION

Figure 1:
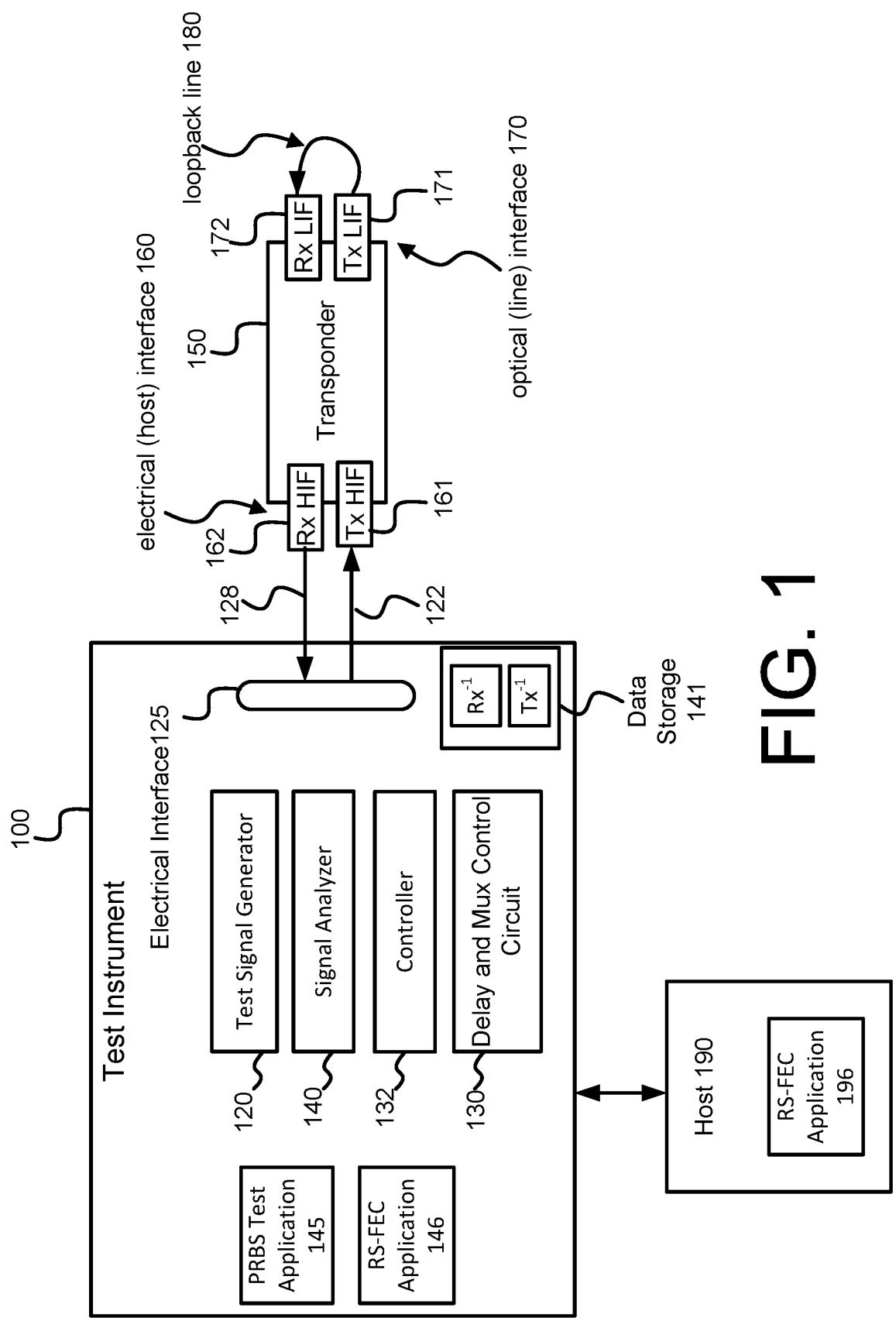
FIG. 1 is a block diagram of a test instrument connected to a transponder, according to an example of the present disclosure.

For simplicity and illustrative purposes, the present disclosure is described by referring to examples thereof. In the following description, numerous specific details are set forth in order to provide a thorough understanding of the present disclosure. It will be readily apparent however, that the present disclosure may be practiced without limitation to these specific details. In other instances, some methods and structures readily understood by one of ordinary skill in the art have not been described in detail so as not to unnecessarily obscure the description of the examples of the present disclosure. As used herein, the terms "a" and "an" are intended to denote at least one of a particular element, the term "includes" means includes but not limited to, the term "including" means including but not limited to, and the term "based on" means based at least in part on.

The present disclosure provides examples of a test instrument and testing methods for determining a transmitter function and a receiver function for an optoelectronic transponder, also referred to as an optical and electrical transponder, to enable forward error correction for the transponder and to enable performance testing of the transponder. The optoelectronic transponder includes an optical interface to transmit and receive optical signals via the optical interface, and an electrical interface to transmit and receive electrical signals via the electrical interface. The transponder may convert electrical signals received from a host via the electrical interface to optical signals for transmission via the optical interface to a destination via a fiber optic network. The transponder may also convert optical signals received via the optical interface to electrical signals for transmission to a destination host via an electrical network, such as an Ethernet network. In data centers, these type of transponders are becoming more prevalent to allow packets on an electrical Ethernet network to be communicated via a high-speed optical network. For example, 100 Gbps transponders are becoming more widely used in data centers to transmit Ethernet packets from hosts to destinations via a high-speed optical network. The transponder discussed below may include a 100 Gbps transponder that performs multiplexing and other operations as governed by the Institute of Electrical and Electronics Engineers (IEEE) 802.3ba standard, and may perform signaling as stated in the International Telecommunication Union (ITU) Optical Transport Lane (OTL) 4.4 specification. Also, C form-factor pluggable (CFP) is a multi-source agreement that describes a specification for pluggable 100 Gbps transceivers. Also, Quad Small Form-factor Pluggable (QSFP) is a compact, hot-pluggable transceiver used for data communications applications. The optoelectronic transponder may be a transceiver that corresponds to a CFP specification and may be a QSFP transceiver. Also, the transponder may include a multi-link gearbox that performs multiplexing as discussed. The multi-link gearbox may conform to the Multi-Link Gearbox Implementation Agreement standard as specified by the Optical Internetworking Forum (OIF). The optoelectronic transponder may also include a transceiver or any device with both an optical interface and electrical interface for transmitting and receiving data.

According to an example of the present disclosure, the test instrument can connect to a transponder to learn internal conversion processes of the transponder. For example, through conversion processes internal to the transponder, the transponder converts electrical signals received via the host interface to optical signals that can be transmitted via the optical interface. In a learning phase, the test instrument learns parameters of the internal conversion processes of the transponder, and the parameters may then be used for testing the transponder and for allowing FEC to be applied from the transponder. For example, multiplexing and delay caused by the internal conversion processes of the transponder scrambles bits received on lanes of the electrical interface. RS-FEC refers to the Reed-Solomon Layer defined in clause 91 of the IEEE 802.3bj standard, which indicates that RS-FEC codes are applied to each of four 25 Gbps lanes going to the optical module of the optical interface. However, the test instrument or any host connected to the electrical interface of the transponder does not have direct access to the optical interface of the transponder to apply the RS-FEC codes to the four 25 Gbps lanes of the optical interface. The test instrument, in the learning phase, learns the signal parameters of the internal conversion processes of the transponder, and then the RS-FEC codes can be applied from the electrical interface of the transponder despite the bit scrambling and delay caused by the internal conversion processes of the transponder. Also, the test instrument may use the learned signal parameters to generate known test patterns at the optical interface, such as pseudorandom binary sequence (PRBS) test patterns to measure bit error rate, optical parameters such as optical modulation amplitude (OMA), receiver sensitivity, jitter, and other measurements that may be performed if the test instrument were to have with direct access to the optical interface.

The signal parameters of the transponder that are associated with its internal conversion processes may be referred to as the transmitter function and the receiver function. The transmitter function includes the signal parameters associated with transmitting electrical signals received via the electrical interface, which are converted to optical signals and are transmitted from the optical interface. The receiver function includes the signal parameters associated with receiving optical signals from the optical interface, which are converted to electrical signals and are transmitted from the electrical interface. The transmitter function may include multiplexing and delay. The multiplexing may include multiplexing from ten lanes (e.g., 10 Gbps per lane) from the electrical interface to four lanes (e.g., 25 Gbps per lane) for the optical interface. The delay is the delay between bits which are transmitted in parallel or received in parallel on separate lanes. The receiver function may include de-multiplexing (e.g., from four lanes to ten lanes) and delay. The IEEE 802.3ba standard describes the ten lane to four lane multiplexing that may be performed by the transponder.

FIG. 1 illustrates a block diagram of a test instrument 100, according to an example of the present disclosure, which is connected to an optoelectronic transponder 150 (hereinafter transponder 150). The test instrument 100 may include a test signal generator 120, a delay and multiplexer (mux) control circuit 130, a hardware controller 132, and a signal analyzer 140. One or more of the components of the test instrument 100 may include machine readable instructions stored on a non-transitory computer readable medium and executed by a processor. The processor may include an integrated circuit designed to perform functions and operations described herein.

The controller 132 and signal analyzer 140 learn the transmitter function (Tx) and receiver function (Rx) associated with multiplexing and delay caused by the transmitter and receiver operations of the transponder 150. From the learned transmitter function Tx and receiver function Rx, an inverse transmitter function, shown as $Tx^{-1}$, and an inverse receiver function, shown as $Rx^{-1}$, are determined and may be stored in a data storage 141. The data storage 141 may include memory or any suitable computer readable storage medium for storing data and/or machine readable instructions used by the test instrument 100.

The delay and mux control circuit 130 controls delay and bit multiplexing based on the learned transmitter and receiver functions of the transponder 150. For example, the delay and mux control circuit 130 can increase or decrease delay of bits on certain lanes, and can multiplex bits onto different lanes according to the inverse transmitter function $Tx^{-1}$ and the inverse receiver function $Rx^{-1}$. Applying $Rx^{-1}$ and/or $Tx^{-1}$ allows applications to be executed that rely on receiving data that is not scrambled or delayed by the transmitter and receiver functions of the transponder 150. For example, RS-FEC application 146 may receive RS-FEC codes that are not scrambled or delayed by the transmitter and receiver functions of the transponder 150, and can apply forward error correction based on the received RS-FEC blocks in the bits. Reed Solomon FEC is one example of error correction that may be performed using FEC codes. Other types of error correction using FEC codes may be performed using the examples described herein. PRBS test application 145 may rely on received bits that are not scrambled or delayed by the transmitter and receiver functions of the transponder 150 to measure performance of the transponder 150.

Also shown is host 190 that can execute RS-FEC application 196 on data received via the delay and mux control circuit 130 after the inverse receiver function $Rx^1$ has been applied to the received data. Accordingly, in a non-testing situation, the delay and mux control circuit 130 may be used to apply the inverse receiver function $Rx^1$ to data received from a source, such as data received from a source connected to the host 190 via an optical network. For example, the transponder 150 receives the data via the optical interface 170; the receiver function Rx of the transponder 150 is applied to the received data, and the data is transmitted to the test instrument 100. The delay and mux control circuit 130 applies the inverse receiver function $Rx^1$ to the received data, and the data is sent to its destination (e.g., host 190), for example, via an electrical interface. The host 190 may execute the RS-FEC application 196 to perform forward error correction on the received data, and may execute other applications based on the received and error-corrected data. The host 190 may be any suitable device to perform these operations. Also, the host 190 may execute the RS-FEC application 196 to generate RS-FEC codes for data to be transmitted via a destination, and the test instrument 100 may receive the data and RS-FEC codes and apply the inverse transmitter function Tx-1 so the RS-FEC codes do not get scrambled when transmitted from the transponder 150 to a destination over the optical line or optical network.

The test signal generator 120 may also generate test signals for measuring the performance of the transponder 150, such as bit error rate, optical parameters such as optical modulation amplitude (OMA), receiver sensitivity, jitter, and other measurements, and the signal analyzer 140 may be used to measure looped back test signals to measure the performance of the transponder 150. In an example, the test signals may be PRBS test patterns, such as PRBS13Q, PRBS31Q, etc., and the signal analyzer 140 may receive looped-back PRBS test patterns to measure performance of the transponder 150. The performance testing may be initiated through the PRBS test application 145.

Electrical interface 125 is an interface that connects to the transponder 150 to send electrical signals to and receive electrical signals from the transponder 150. The electrical interface 125 may include a physical connector and/or a wire. Transmit path lanes 122 are used to transmit digital data to the transponder 150 and receive path lanes 128 are used to receive digital data from the transponder 150. The lanes 122 and 128 may include non-return-to-zero (NRZ) lanes carrying NRZ encoded data, however, other types of encoding may be used. The lanes 122 and 128 may be serial lanes but together can carry bits for parallel data transmission.

Transponder 150 includes electrical interface 160, also referred to as a host interface, and optical interface 170, also referred to as a line interface. The electrical interface 160 may connect to an electrical interface of a host device. For example, as shown in FIG. 1, the electrical interface 160 may connect to the electrical interface 125 of the test instrument 100 to send data to and receive data from the test instrument 100. The electrical interface 160 is shown as including transmit path test instrument host interface (Tx HIF) 161 to receive data from the test instrument 100, and a receive path test instrument host interface (Rx HIF) 162 to transmit data to the test instrument 100. Tx HIF 161 and Rx HIF 162 may be a single interface or separate interfaces. The optical interface 170 may connect to a fiber optic cable to carry data toward a destination or to receive data from a source. The optical interface 170 is shown as including a transmit path line interface (Tx LIF) 171 for transmitting data on the optical fiber, and a receive path line interface (Rx LIF) 172 for receiving data from the optical fiber. A loopback line 180 may be connected to Tx LIF 171 and Rx LIF 172 to loopback optical signals transmitted from the transponder 150 back to the transponder 150. The loopback line 180 may be an optical cable connecting Tx LIF 171 and Rx LIF 172. The loopback line 180 provides a return path for test signals which may include test signals generated by the test signal generator 120 or test signals generated by other devices, such as an internal PRBS generator of the transponder 150, to learn the transmit and receive functions of the transponder 150 and to measure performance of the transponder 150.

Figure 2:
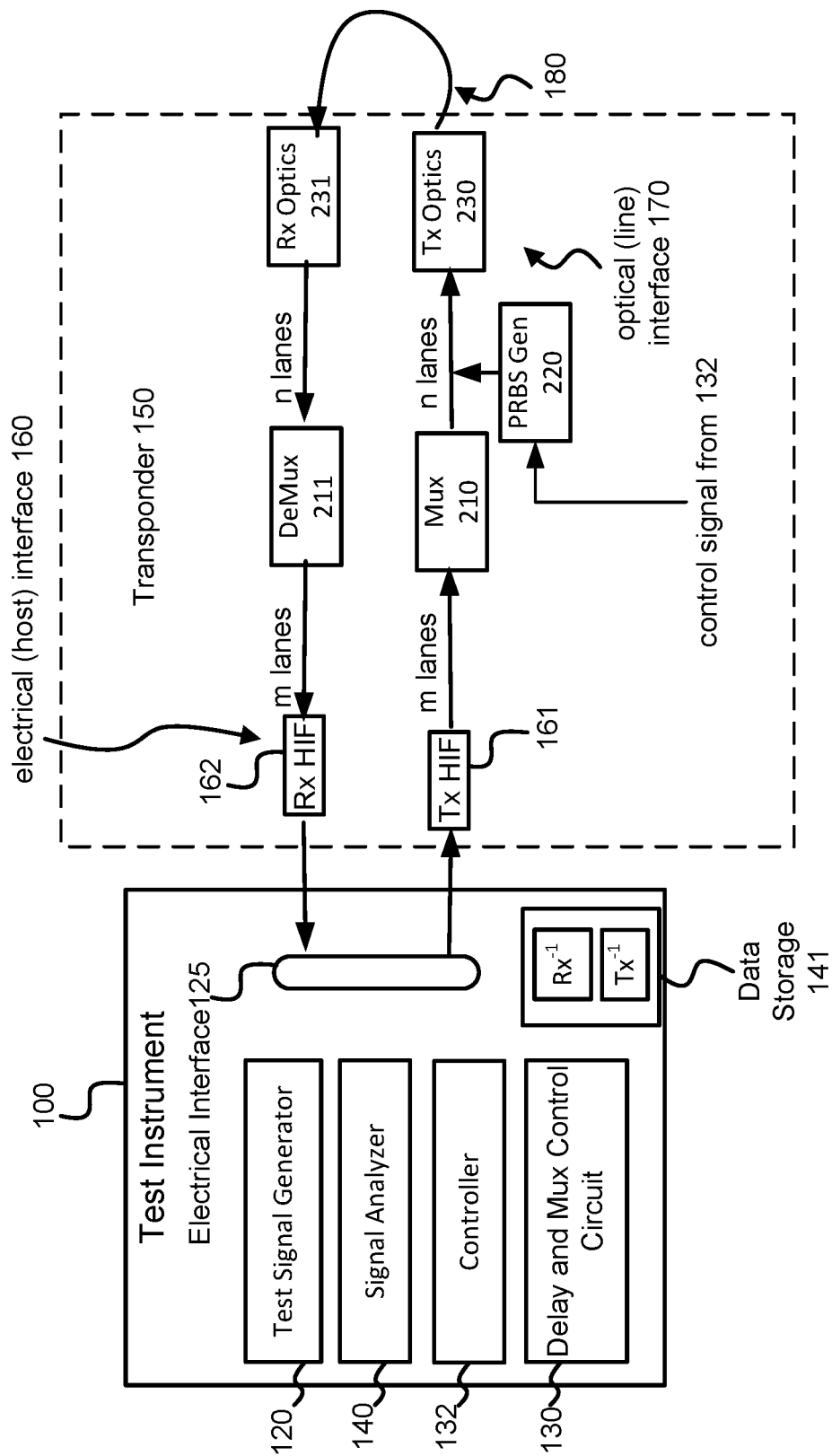
FIG. 2 is another block diagram of a test instrument connected to a transponder, according to an example of the present disclosure.

FIG. 2 illustrates additional details of the transponder 150. Not all the features of the test instrument 100 and the host 190 from FIG. 1 are shown in FIG. 2 in order to be able to show the additional features of the transponder 150, however, those features may be included. The transponder 150 converts "m" electrical lanes into "n" lanes for transmission via the optical interface 170, and converts "n" lanes carrying received optical data into "m" electrical lanes for transmission to a connected host, such as test instrument 100, whereby "m" and "n" are integers greater than 0 and "m" is not equal to "n". The "m" lanes, for example, are 10×10 Gbps lanes (i.e., ten lanes each having 10 Gbps lane rate) or may be 20×5 Gbps virtual lanes as is further discussed with respect to FIG. 4, and the "n" lanes, for example, are 4×25 Gbps lanes. In other examples, the "m" lanes may include 40 Gbps lanes or may have other line rates, and in other examples the number of "m" lanes may be different than 10. Also, in other examples, the "n" lanes may have line rates other than 25 Gbps, and the number of "n" lanes may be different than 4. Multiplexer 210 multiplexes bits carried on the "m" lanes to the "n" lanes, and demultiplexer 211 demultiplexes bits carried on the "n" lanes to the "m" lanes.

The optical interface 170 may include laser Tx optics 230. In an example, the Tx optics 230 includes four lasers for transmitting data from the "n" lanes on four different wavelengths. Multi-mode fiber or single-mode fiber may be used for the optical line connected to the optical interface 170. On the receive side, receiving Rx optics 231, which may include photodiodes and amplifiers, receives the four different wavelengths and converts the optical signals to electrical signals placed on the "n" lanes that are input to the demultiplexer 211. The demultiplexer 211 demultiplexes bits carried on the "n" lanes to the "m" lanes for transmission to the host via the electrical interface 160.

The transponder 150 may include an internal PRBS generator 220. The controller 132 may trigger the internal PRBS generator 220 to send a PRBS test signal by sending a control signal to the internal PRBS generator 220 via a control path that may be external to the "m" lanes. The PRBS test signal sent from the internal PRBS generator 220 is not scrambled by the multiplexing of the multiplexer 210, and is used by the signal analyzer 140 and controller 132 to learn the Rx function of the transponder 150. For example, the Tx function may include the bit mappings from the "n" lanes to the "m" lanes, and the delay. After the Rx function is determined, the Tx function may be determined, as is further discussed below. The Tx function may include the bit mappings from the "m" lanes to the "n" lanes, and the delay.

Figure 3:
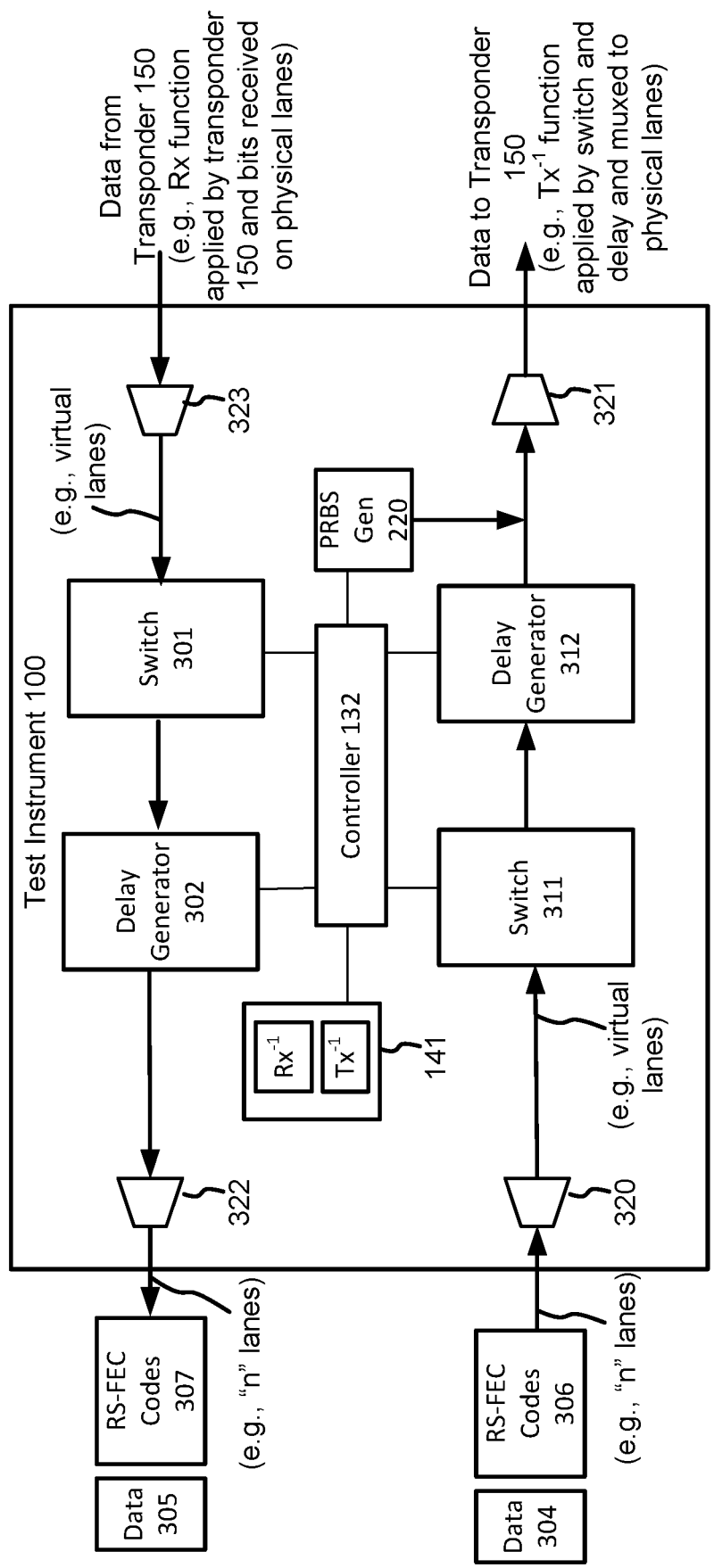
FIG. 3 is a block diagram of a test instrument, according to an example of the present disclosure.

As discussed above, the delay and mux control circuit 130 controls delay and bit multiplexing based on the learned Tx function and Rx function of the transponder 150. For example, the delay and mux control circuit 130 can add or remove delay on certain lanes and can multiplex bits onto different lanes according to the inverse transmitter function $Tx^{-1}$ and the inverse receiver function $Rx^{-1}$ which are determined from the Tx function and the Rx function. FIG. 3 shows an example of components of the delay and mux control circuit 130 and other components of the test instrument 100 that may control delay and bit multiplexing based on the inverse transmitter function $Tx^{-1}$ and the inverse receiver function $Rx^{-1}$. For example, data 304 is to be transmitted by the host and includes RS-FEC codes 306 generated, for example, by RS-FEC application 146 or 196. The RS-FEC codes 306 may be generated by a Reed Solomon polynomial divider which may produce 140 bit RS-FEC codes that are added to compressed message blocks. The RS-FEC application generating compressed message blocks including the RS-FEC codes 306, for example, places the compressed message blocks on "n" lanes, such as 4×25 Gbps lanes. The transponder 150 is used to transmit the compressed message blocks. The RS-FEC application on the host does not have access to the "n" lanes that are provided to the optical interface 170 of the transponder 150, so the test instrument 100 applies the inverse transmitter function $Tx^{-1}$ so the compressed message blocks including the RS-FEC codes 306 that are provided on the "n" lanes connected to the optical interface 170 match the compressed message blocks including the RS-FEC codes 306 provided from the RS-FEC application. For example, the bit sequence on the "n" lanes output from the RS-FEC application should match the bit sequence on the "n" lanes provided to the optical interface 170, and the timing of the bits on each lane should match. Similarly, the test instrument 100 applies the inverse receiver function $Rx^{-1}$ so compressed message blocks received on the "n" lanes connected to the optical interface 170 match the compressed message blocks provided to the RS-FEC application at the host.

Referring to FIG. 3 and the transmitter side of the test instrument 100, compressed message blocks including the data 304 and the RS-FEC codes 306 are provided on the "n" lanes, for example, to demultiplexer 320 which demultiplexes the "n" lanes to virtual lanes, assuming the transponder 150 also applies its multiplexing operations on the virtual lanes. For example, the demultiplexer 320 demultiplexes 4×25 Gbps lanes to 20×5 Gbps virtual lanes. Virtual lanes are further described with respect to 402 in FIG. 4. The controller 132 controls the switch 311 to multiplex bits of the compressed message blocks including the data 304 and RS FEC codes 306 according to the inverse receiver function $Rx^{-1}$. The bit multiplexing of the switch 311 may include an inverse of the multiplexing performed by the multiplexer 210 of the transponder 150, as is further discussed below with respect to FIG. 6. The controller 132 controls the delay generator 312 to increase or decrease delay for particular lanes carrying the bits according to the inverse transmitter function $Tx^{-1}$. The delay increased or decreased by the delay generator 312 is inverse to the delay increased or decreased by the transponder 150. Therefore, when the transponder 150 applies the Tx function, the data 304 and RS FEC codes 306 should be in a state that is similar to when it was received at the test instrument 100 from the RS-FEC application. After the switch 311 and the delay generator 312 applies the inverse transmitter function $Tx^{-1}$, multiplexor 321 may multiplex the virtual lanes to physical lanes, e.g., 10×10 Gbps lanes, so the compressed message blocks can be transmitted to the transponder 150 via the electrical interface 125 and the electrical host interface 160. The transponder 150 may demultiplex the received message blocks to the virtual lanes before the delay and the bit scrambling of the transmitter function Tx is applied by the transponder 150.

The receiver side of the test instrument 100 operates similarly to the transmitter side. For example, data received from the transponder 150 on 10×10 Gbps physical lanes is demultiplexed at 323 to virtual lanes. The inverse receiver function $Rx^{-1}$ is applied by the switch 301 and the delay generator 302. The controller 132 may identify alignment markers, such as RS-FEC alignment markers, or other attributes in the received data to determine when to start applying the inverse receiver function $Rx^{-1}$ through the switch 301 and delay generator 302. The alignment markers may be inserted at particular locations on the lanes. IEEE 802.3 describes specification for placing alignment markers, including RS-FEC alignment markers, in the data on the lanes. After determining when to start applying the inverse receiver function $Rx^{-1}$, e.g., using the alignment markers, the data may then be multiplexed at 322 to the "n" lanes (e.g., 4×25 Gbps) which the RS-FEC expects to receive the data 305 and RS-FEC codes 307 and perform forward error correction. Accordingly, the data 305 and the RS-FEC codes 307 of the data 305 should be in a similar state when it was transmitted. The RS-FEC alignment markers in the data may also be used to learn the receiver function Rx. For example, for some transponders, the transmit function Tx remains constant as long as the host is sending data to the transponder, but when the transponder receiver is in a live data mode, then a new receiver function Rx may be introduced each time an optical signal is injected or received at the transponder. The test instrument 100 can automatically synchronize to the new receiver function without requiring a loopback.

For example, the initial Rx function is learned to calculate the inverse transmitter function $Tx^{-1}$ function, which may be temporary. What tends to happens is that when an optical signal is received or transmitted from the optical interface 170, then an electrical interface (not shown) between the optical interface 170 and the multiplexer 210 or demultiplexer 211 gets disrupted. This forces the re-synchronizing of clock recovery circuits and first-in-first-out (FIFO) buffers each time which causes a new receiver function Rx to occur just by the act of turning off and on the laser in the optical interface 170. In this scenario, the receiver function Rx may be learned without using the loopback line 180. Instead, the RS-FEC alignment markers are used. The RS-FEC alignment markers are a predetermined sequence of bits, and may be inserted in each of the "n" lanes. The controller 132 may identify the received alignment markers, and compare them to what the alignment markers should be, such as after going through a known multiplexing operation for a 1-to-5 multiplexer (e.g., round robin placement of bits on each of the 5 lanes with zero relative bit skew). Then matrices may be generated such as described with respect to FIGS. 7-8 to illustrate the delay and bit positions. From the differences and matrices, the controller 132 can determine the receiver function Rx, and based on the receiver function Rx, determine the inverse receiver function $Rx^{-1}$.

Figure 4:
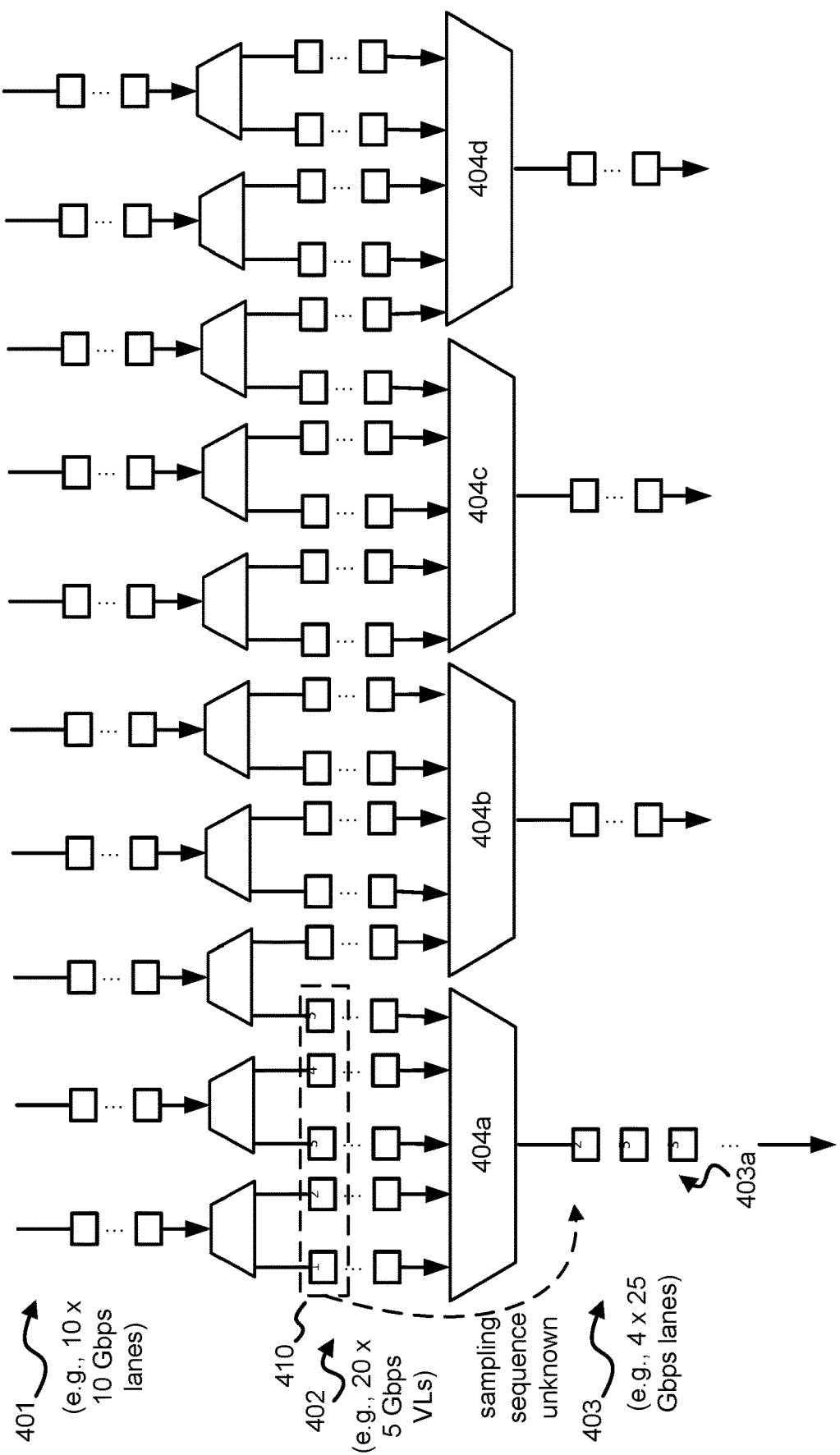
FIG. 4 shows multiplexing of a transmitter side, according to an example of the present disclosure.

FIG. 4 illustrates multiplexing and demultiplexing that may be performed by the transponder 150. For example, FIG. 4 shows ten lane to four lane (e.g., 10-to-4) multiplexing. The IEEE 802.3ba standard describes 10-to-4 multiplexing for 40 Gbps operation (also called 40 Gigabit Ethernet) and 100 Gbps operation (also called 100 Gigabit Ethernet). The multiplexing may be performed by the transponder 150. For example, the multiplexer 210 shown in FIG. 2 may perform the multiplexing described in FIG. 4. In FIG. 2, "m" lanes are input to the multiplexer 210, and the multiplexer 210 multiplexes the "m" lanes into the "n" lanes. The "m" lanes from FIG. 2 are the ten lanes 401 in the example of FIG. 4, and the "n" lanes that are the output of the multiplexer 210 shown in FIG. 2 are the four lanes 403 in the example of FIG. 4. For example, the lanes 401 may include 10×10 Gbps lanes that are input to the multiplexer 210. The lanes 401 may include physical lanes comprising transmission media carrying the bits of each lane. The data carried by the lanes 401 may be from a host, such as the test instrument 100 or another host. The multiplexer 210 multiplexes the lanes 401 into twenty virtual lanes 402. The virtual lanes 402 may include containers containing particular bits of the lanes 401. For example, the virtual lanes 402 comprise bits from the lanes 401 that are segregated or marked as being part of a particular virtual lane. In an example, every other bit of a lane of the lanes 401 is put into one of the virtual lanes 402. The multiplexer 210 multiplexes the twenty virtual lanes to four physical lanes 403. For example, the lanes 403 are 4×25 Gbps lanes. Accordingly, the multiplexing may include multiplexing five lanes, such as five of the virtual lanes 402 at 5 Gbps per virtual lane, to one lane, such as one of the 25 Gbps lanes 403. In other words, the 10-to-4 multiplexing may include four 5-to-1 multiplexers, shown as 404*a-d*, that each multiplex five virtual lanes (e.g., 5×5 Gbps) to one physical lane at 25 Gbps. The sequence for sampling bits by the four 5-to-1 multiplexers, shown as 404*a-d*, from the virtual lanes 402 to place on the lanes 403 is unknown. For example, as shown in FIG. 4, bits 410 are from virtual lanes and are multiplexed by multiplexer 404*a* onto lane 403*a*. The sequence for sampling the bits 410 to place onto the lane 403*a* is unknown. The test instrument 100 determines this, which is part of the transmitter function Tx of the transponder 150, as is further discussed below. Also, there may be a delay, which is the skew of the bits on each lane, which is also determined by the test instrument 100. The delay is also part of the Tx function.

The demultiplexing may be performed in the reverse direction of FIG. 4. The demultiplexing may be performed by the demultiplexer 211 shown in FIG. 2 which demultiplexes the "n" lanes of bits received from the optical interface 170 to the "m" lanes of bits for transmission to the electrical interface 160. For example, the demultiplexing may include demultiplexing lanes 403 to lanes 401 shown in FIG. 4. For example, bits from 4×25 Gbps lanes 403 are sampled in an unknown bit sequence to place bits onto 20×5 Gbps virtual lanes 402. Bits from the virtual lanes 402 are then placed on the 10×10 Gbps lanes 401. As is further discussed below, the test instrument 100 determines the sequence for sampling bits from lanes 403 to lanes 402, which is part of the receiver function Rx for the transponder 150. Also, the test instrument 100 determines the delay, which is also part of Rx.

The multiplexing and demultiplexing, which is initially unknown and which is determined or learned by the test instrument 100, is performed in the transponder 150. The multiplexing and demultiplexing also discussed above may be performed in the test instrument 100, however, the test instrument 100 applies the inverse receiver function $Rx^{-1}$ or the inverse transmitter function $Tx^{-1}$ to counteract the receiver function Rx or the transmitter function Tx applied in the transponder 150. Also, the multiplexer 210 may comprise one or more multiplexers or demultiplexers, and the demultiplexer 211 may comprise one or more multiplexers or demultiplexers, such as shown in FIG. 4. For example, referring to FIG. 4, the lanes 401 may be demultiplexed to the virtual lanes 402, and then the transmitter function Tx applied in the transponder 150. Then, the virtual lanes 402 are multiplexed to the lanes 403 for transmission of the data carried by the lanes 403 via the optical interface 170. These operations may be performed by the multiplexer 210 shown in FIG. 2. The reverse operations may be performed by the demultiplexer 211. Similar operations are performed in the test instrument 100.

Figure 5:
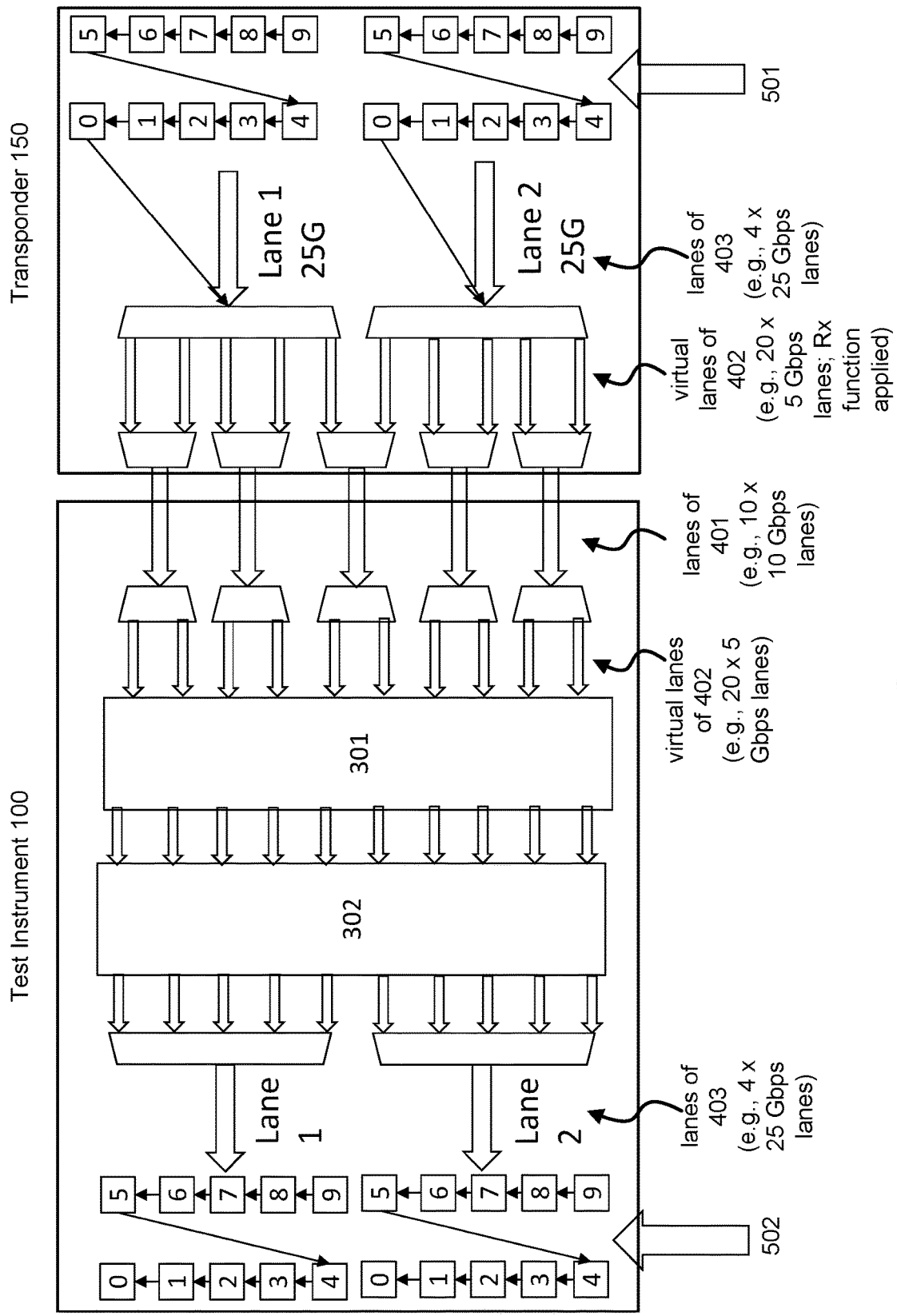
FIG. 5 shows demultiplexing of a receiver side, according to an example of the present disclosure.

FIG. 5 shows an overview of the receiver side operation of the transponder 150 and the test instrument 100 and application of the inverse receiver function $Rx^{-1}$ to further explain that the sequence of bits 501 received on the lanes connected to the optical interface 170 of the transponder should match the sequence of bits 502 output from the delay and mux control circuit shown in FIG. 3 which may be provided to a host application, such as an RS-FEC application. For example, the bits 501 include 10 bit RS-FEC codes. The bits 502 provided to the RS-FEC application should be in the same sequence and should be received at the same time or at the time the RS-FEC application expects to receive the bits 502 in order to perform forward error correction. Only 2 of the 4 lanes of the lanes 403 are shown if FIG. 5 but the demultiplexing includes demultiplexing all 4 of the lanes. The transmitter side multiplexing is the mirror of the receiver side demultiplexing shown in FIG. 5.

Referring to FIG. 5, the bits 501 carried on lanes 403 are demultiplexed to the virtual lanes 402, and the receiver function Rx is applied. Then, the virtual lanes 402 are multiplexed to the lanes 401 for transmission to the host, such as test instrument 100. At the test instrument 100, the lanes 401 are demultiplexed to the virtual lanes 402. The receiver function $Rx^{-1}$ is applied by the switch 301 and the delay generator 302 and the virtual lanes 402 are multiplexed to lanes 403 to provide the bits 502 having the same sequence and timing of the bits 501.

Figure 6:
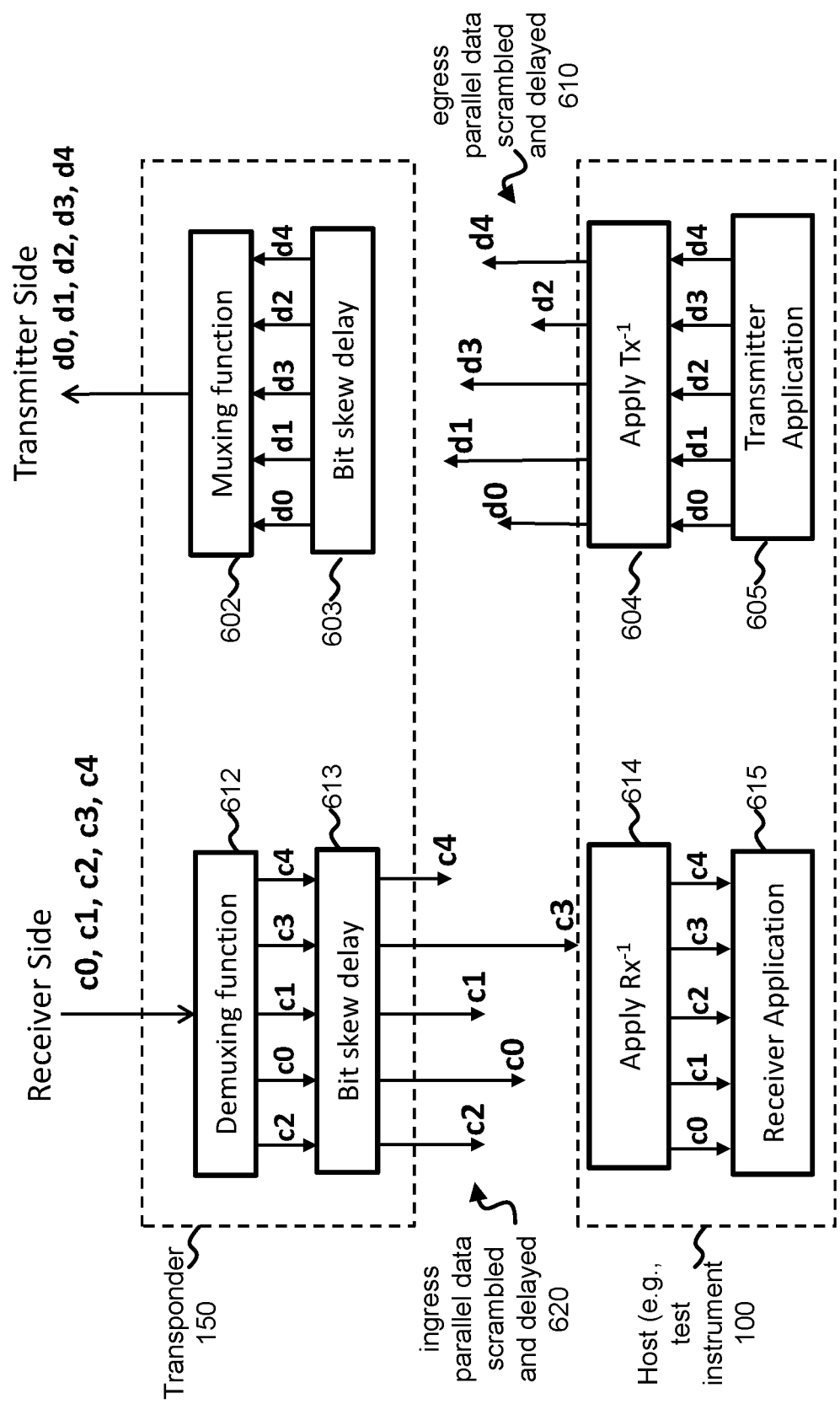
Figure 8:
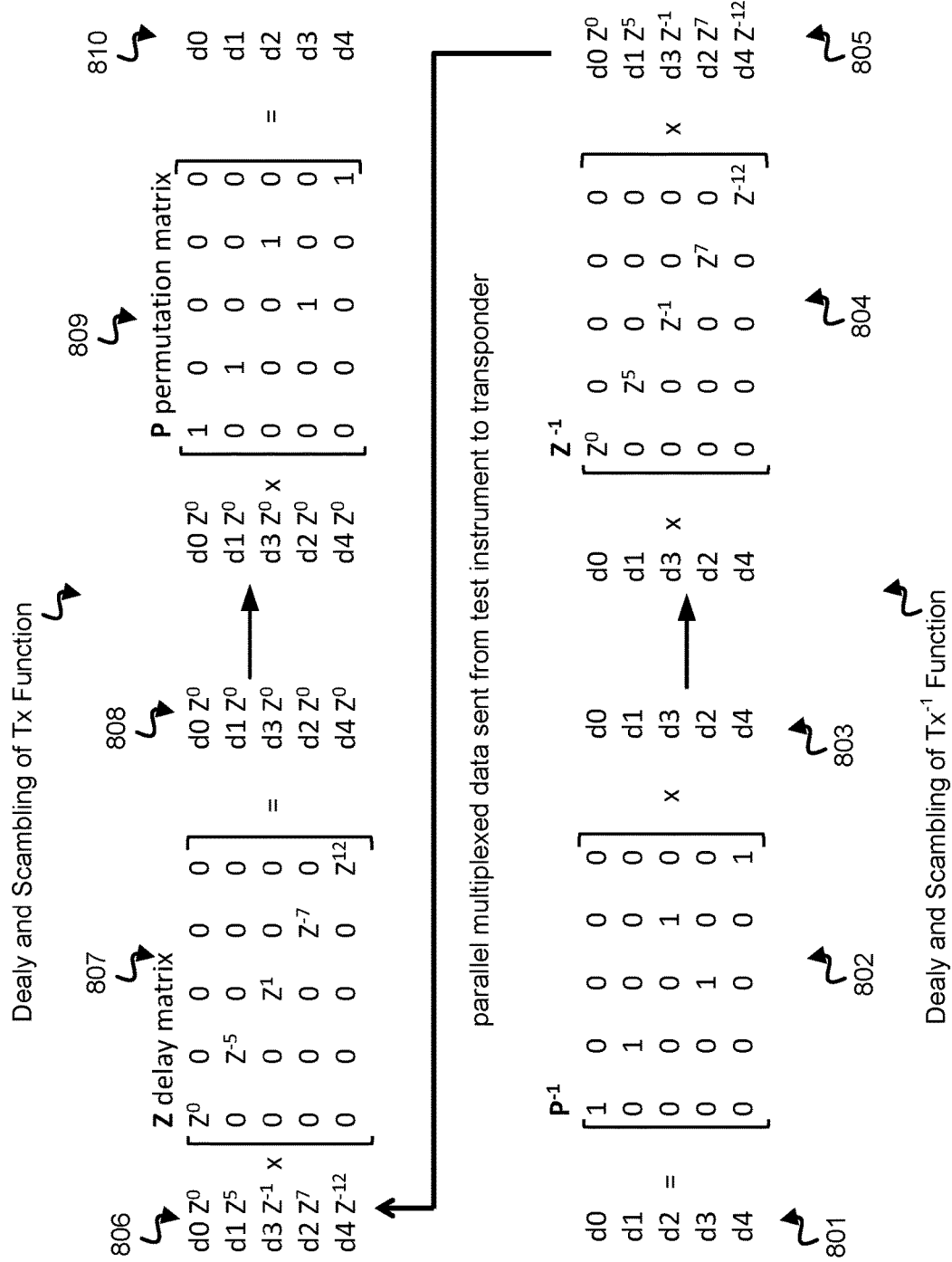

As discussed above with respect to FIG. 1-3, the controller 132 and signal analyzer 140 learn the transmitter function Tx and receiver function Rx associated with multiplexing and delay caused by the transmitter and receiver operations of the transponder 150. From the learned transmitter function Tx and receiver function Rx, the inverse transmitter function $Tx^{-1}$, and the inverse receiver function $Rx^{-1}$ are determined by the test instrument 100. The test instrument 100 may apply the inverse transmitter function $Tx^{-1}$ and the inverse receiver function $Rx^{-1}$ so the sequence and timing of the bits transmitted from the host (e.g., from the PRBS test application 145 or the RS-FEC application 146 of the test instrument 100 or the RS-FEC application 196 from the host 190 shown in FIG. 1) to the transponder 150 are maintained at the lanes (e.g., lanes 403) connected to the optical interface 170 of the transponder 150, such as maintaining the timing and sequence of bits. Also, on the receiver side, such as described with respect to FIG. 5, the sequence and timing of the bits received by the transponder 150 are maintained for the transmission of the bits from the transponder 150 to the host (e.g., to the PRBS test application 145 or the RS-FEC application 146 of the test instrument 100 or the RS-FEC application 196 from the host 190 shown in FIG. 1). Furthermore, as shown in FIG. 3, the test instrument 100 may include circuit components for applying the inverse transmitter function $Tx^{-1}$ and the inverse receiver function $Rx^{-1}$ for maintaining the timing and sequence of bits for execution of RS-FEC or other applications. FIGS. 6-8 show examples of the test instrument 100 applying the inverse transmitter function $Tx^{-1}$ and the inverse receiver function $Rx^{-1}$ for maintaining the timing and sequence of bits.

FIG. 6 shows 5-to-1 multiplexing (e.g., muxing function 602) on the transmitter side of the transponder 150 and 1-to-5 demultiplexing (e.g., demuxing function 612) on the receiver side of the transponder 150. The 5-to-1 multiplexing may include the multiplexing of lanes 402 to lanes 403 shown in FIG. 4, and the 1-to-5 demultiplexing may include the demultiplexing of lanes 403 to lanes 402, which is also shown in FIG. 5. FIG. 6 also shows delays, shown as bit skew delays 603 and 613, of the transponder 150. Also, FIG. 6 shows the host, such as test instrument 100, applying the inverse transmitter function $Tx^{-1}$ at 604 and applying the inverse receiver function $Rx^{-1}$ at 614.

The applying of the inverse transmitter function $Tx^{-1}$ at 604 is discussed first with respect to FIG. 6. For example, a transmitter application 605 generates data. In an example, the transmitter application 605 may include any application that generates data for transmission to a destination, and the transponder 150 is transmitting the data to the destination. The transmitter application 605 may include the applications 145, 146 and 196 shown in FIG. 1. Knowing that the delay and scrambling of bits of the transmitter function Tx will occur at the transponder 150, such as shown at 602 and 603, the data from the transmitter application 605 is pre-scrambled and pre-delayed at 604 according to the inverse transmitter function $Tx^{-1}$ to counteract the delay and scrambling of bits of the transmitter function Tx that will occur at 602 and 603 of transponder 150. Counteracting the delay of the transmitter function Tx may include adding or removing delay that is the opposite of the delay or the inverse of the delay at 603 of the transmitter function Tx, and counteracting the bit scrambling of the transmitter function Tx may include pre-scrambling the sequence of the bits to be opposite the bit scrambling or the inverse of the scrambling that will occur at 602. For example, as shown in FIG. 6, bits d0-d4 are output in parallel from the transmitter application 605. At 604, the bits d0-d4 are scrambled and are delayed on each lane according to the inverse transmitter function $Tx^{-1}$ to counteract the delay and scrambling of bits of the transmitter function Tx. For example, the switch 311 shown in FIG. 3 may scramble the bits, and the delay generator 312 may add or remove delay according to the inverse transmitter function $Tx^{-1}$. FIG. 6 shows the scrambled and delayed bits 610 at the output of 604. The scrambled and delayed bits at 610 are received at the transponder 150, and the transmitter function Tx of the transponder 150 caused the bits to be delayed at 603, and scrambled again at 602. However, the delay at 603 causes the bits d0-d4 to align, and the bit scrambling at 602 causes the bits d0-d4 to have the same sequence as output from the transmitter application 605. The bits d0-d4 are output for example on a single 25 Gbps channel, which may include one of the four lanes 403 shown in FIG. 4, and are then transmitted from the optical interface 170 of the transponder 150. A mirrored operation is performed on the receiver side as is now discussed.

On the receiver side, another example is described whereby bits c0-c4 are received at the optical interface 170 of the transponder 150. The bits c0-c4 are output for example on a single 25 Gbps channel, which may include one of the four lanes 403 shown in FIG. 4. The demultiplexing function 612 is the demultiplexing of the bits, which may be performed by the demultiplexer 211 shown in FIG. 2. The demultiplexing scrambles the bits c0-c4, and at 613, the bits c0-c4 are delayed. The scrambled and delayed bits are shown at 620. In the test instrument 100, the inverse receiver function $Rx^{-1}$ is applied at 614, such as by switch 301 and delay generator 302 shown in FIG. 3. As a result, the timing and the sequence of the bits c0-c4 is set to match the timing and the sequence of the bits c0-c4 as received on one of the 25 Gbps lanes of the lanes 403 shown in FIG. 4. Receiver application 615, which may include any of the applications 145, 146 and 196 shown in FIG. 1, may then process the data. For example, if the bits c0-c4 include RS-FEC codes, the RS-FEC codes are not scrambled and delayed and instead match the timing and sequence of the bits c0-c4 as received on one of the 25 Gbps lanes. Thus, RS-FEC that would be applied to the bits c0-c4 as received on one of the 25 Gbps lanes from the optical interface 170 of the transponder 150, can now be applied to the bits received from the electrical interface 160 of the transponder 150.

FIGS. 7-8 further describe applying the inverse transmitter function $Tx^{-1}$ at 604 and applying the inverse receiver function $Rx^{-1}$ at 614. FIG. 7 shows the receiver side of FIG. 6 whereby the bits c0-c4 are received, for example, after being demultiplexed onto lanes, such as virtual lanes of the virtual lanes 402 shown in FIG. 4. 701 shows the sequence of bits c0, c1, c2, c3, c4 received on the lanes. As shown in FIG. 6 at 612 and 613, the sequence of the bits c0-c4 are scrambled and the bits may be delayed on each lane according to the bit scrambling and delay of the receiver function Rx. In FIG. 7, the bit scrambling of the receiver function Rx is shown at 702 and 703. 702 illustrates the scrambling of the bits c0-c4 through a permutation matrix P. Each column of the permutation matrix P represents the possible different positions of the bits c0-c4 on five lanes, such as five of the lanes 402 connected to 404a shown in FIG. 4. A "1" in each column indicates the actual position of the bit in the scrambled sequence caused by the bit scrambling of the receiver function Rx. For example, c0 is in position 2 of the scrambled sequence (e.g., second lane), c1 is in position 3 (e.g., third lane), c2 is in position 1 (e.g., first lane), c3 is in position 4 (e.g., fourth lane), and c4 is in position 5 (e.g., fifth lane). The scrambled sequence is shown at 703, i.e., c2, c0, c1, c3, c4. The bits c1-c4 are also delayed, which is caused by the receiver side of the transponder 150. The amount of delay is graphically shown at 620 with the length of the arrows. Furthermore, as shown at 620 in FIG. 6, the delay is on each lane. The Z delay matrix at 704 is shown to represent the possible delays for each bit, and the amount of delay for each bit is shown at 704. For example, c2 and c1 are not delayed (e.g., 0 delay). The transmission of c4 is delayed prior to c2 and c1 by four units (represented by $Z^{-4}$). The transmission of c0 on its lane is prior to c2 and c1 by two units (represented by $Z^2$), and the transmission of c3 on its lane is prior to c2 and c1 by sixteen units (represented by $Z^{16}$). Each unit represents the same predetermined length of time. 705 shows the delay and bit scrambling of c0-c4 according to the Rx function.

In FIG. 7, 706-710 represent the application of the inverse receiver function $Rx^{-1}$ to 705. For example, at 706, the scrambled and delayed bits of 705 are received at the delay and mux control circuit 130 shown in FIG. 2, and components of the delay and mux control circuit 130 are further shown in FIG. 3. Delay is applied, for example by the delay generator 302 shown in FIG. 3, to the bits. 707-708 in FIG. 7 show applying the delay of the inverse receiver function $Rx^{-1}$. For example, the applied delays undue the delays caused by the transponder at 704. $Z^{-1}$ shown at 707 is the mathematical inverse of the Z delay matrix shown at 704. 708 indicates that the delay from 704 is inversed, such as by the delay generator 302. Then, the bits are scrambled at 709 (such as by the switch 301 shown in FIG. 3) according to the bit scrambling of the inverse receiver function $Rx^{-1}$ to undue the scrambling of Rx shown at 702 and 703. $P^{-1}$ shown at 709 is the mathematical inverse of the P permutation matrix shown at 702. 710 illustrates that the sequence and 0 delay of the bits after applying the inverse receiver function $Rx^{-1}$ matches the initial sequence and 0 delay at 701.

FIG. 8 shows the transmitter side of FIG. 6 whereby the bits d0-d4 are generated by the transmitter application and are transmitted in an initial sequence d0, d1, d2, d3, d4 shown at 801. Then, the inverse transmitter function $Tx^{-1}$ is applied, such as by the switch 311 and the delay generator 312 shown in FIG. 3 of the delay and mux control circuit 130. For example, at 802, the bits are scrambled according to the bit scrambling of the inverse transmitter function $Tx^{-1}$. 802 shows the inverse permutation matrix $P^{-1}$ that indicates how the bits are to be scrambled. The results of the bit scrambling according to the inverse transmitter function $Tx^{-1}$ is shown at 803, whereby the scrambled sequence is d0, d1, d3, d2, d4. Then, delays are applied according to the inverse transmitter function $Tx^{-1}$. The delays of the inverse transmitter function $Tx^{-1}$ are shown as inverse Z delay matrix $Z^{-1}$, and the result is shown at 805. $P^{-1}$ and $Z^{-1}$ are the mathematical inverse matrices of the Z and P matrices shown at 807 and 809, respectively, of the transmitter function Tx. Accordingly, the bit scrambling and delay of the inverse transmitter function $Tx^{-1}$ is undone or reversed by the application of the transmitter function Tx, shown at 806-810, so the resulting bits, shown at 810, have the same bit sequence as the initial sequence of 801 and are not delayed.

Based on the application of the inverse transmitter function $Tx^{-1}$ and the inverse receiver function $Rx^{-1}$ as discussed above with respect to FIGS. 7-8 and as discussed elsewhere in the present disclosure, RS-FEC applications, which typically require access to RS-FEC codes transmitted on the lanes 403 (e.g., 4×25 Gbps lanes) shown in FIG. 4 or received on the lanes 403, can now be executed based on RS-FEC codes received via the host interface of the transponder (even if the RS-FEC codes are scrambled and delayed by the transponder) or based on RS-FEC codes transmitted to the host interface of the transponder (even if the RS-FEC codes are scrambled and delayed by the transponder). Also, performance testing may be performed without having direct access to the lanes 403. For example, the test signal generator 120 shown in FIGS. 1-2 may generate PRBS test patterns to measure bit error rate (BER) or other parameters. The PRBS test patterns are looped back via the loop back line 180 and are received at the test instrument 100 via the host interface 160. The signal analyzer 140 analyzes the looped back PRBS test patterns to determine differences from the initially transmitted PRBS test patterns to measure BER or other parameters. Even though the initially transmitted PRBS test patterns and the looped back PRBS test patterns may be scrambled and delayed by the transponder 150, the application of the inverse transmitter function $Tx^{-1}$ and the inverse receiver function $Rx^{-1}$ reverses the bit scrambling and delay to allow for proper measurements.

Figure 9:
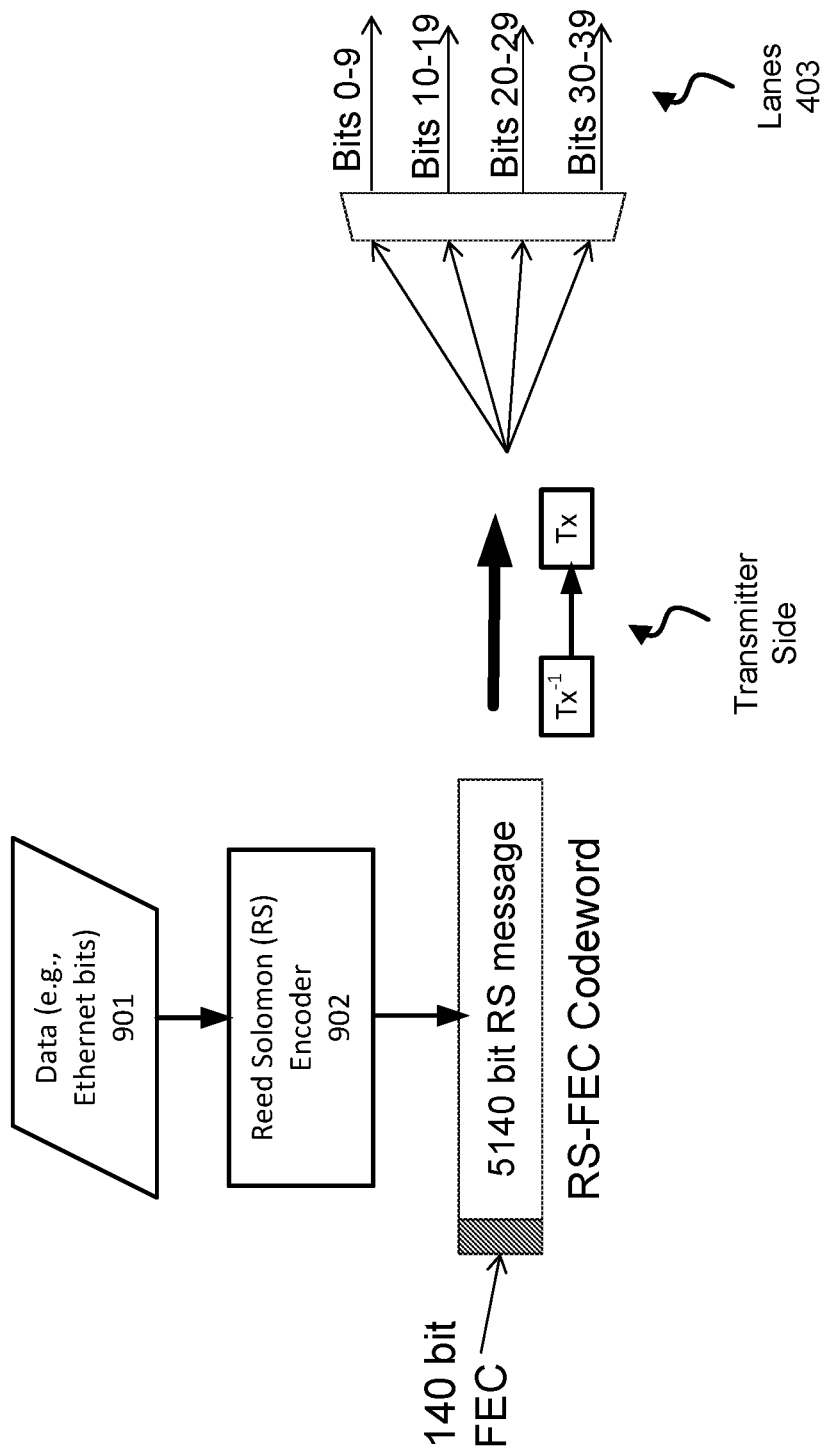
FIG. 9 shows forward error correction, according to an example of the present disclosure.

FIG. 9 shows an example of transmitting FEC codes, such as RS-FEC codes. RS-FEC maintains the same line rate with compression of overhead, such as 64 bit(b)/66*b* to 256*b*/257*b* transcoding. A Reed Solomon polynomial divider, which may include a linear feedback shift register (LFSR), produces 140 bit FEC codes added to compressed message blocks of data. For example, as shown in FIG. 9, RS-Encoder 902 generates FEC codes (e.g., 140 bit) from the data 901 and the FEC codes are appended to compressed message blocks of the data 901 to create an RS-FEC codeword. Generation of the RS-FEC codeword may be done by RS-FEC application 146 or 196 shown in FIG. 1. The inverse transmitter function $Tx^{-1}$ is applied at the test instrument 100 and then the transmitter function Tx is applied at the transponder 150 such as described with respect to the transmitter side of FIG. 6. Then, the RS-FEC codeword is distributed across the four lanes 403, 10 bits at a time (i.e., one RS symbol). The receiver side is not shown but is the mirror of the transmitter side. On the receiver side, the codeword is found by slipping bits until 10-bit symbols and alignment markers are found. Once aligned, the codeword is put back through LFSR and FEC is applied to fix the correctable errors and report statistics on the error correction.

Figure 10:
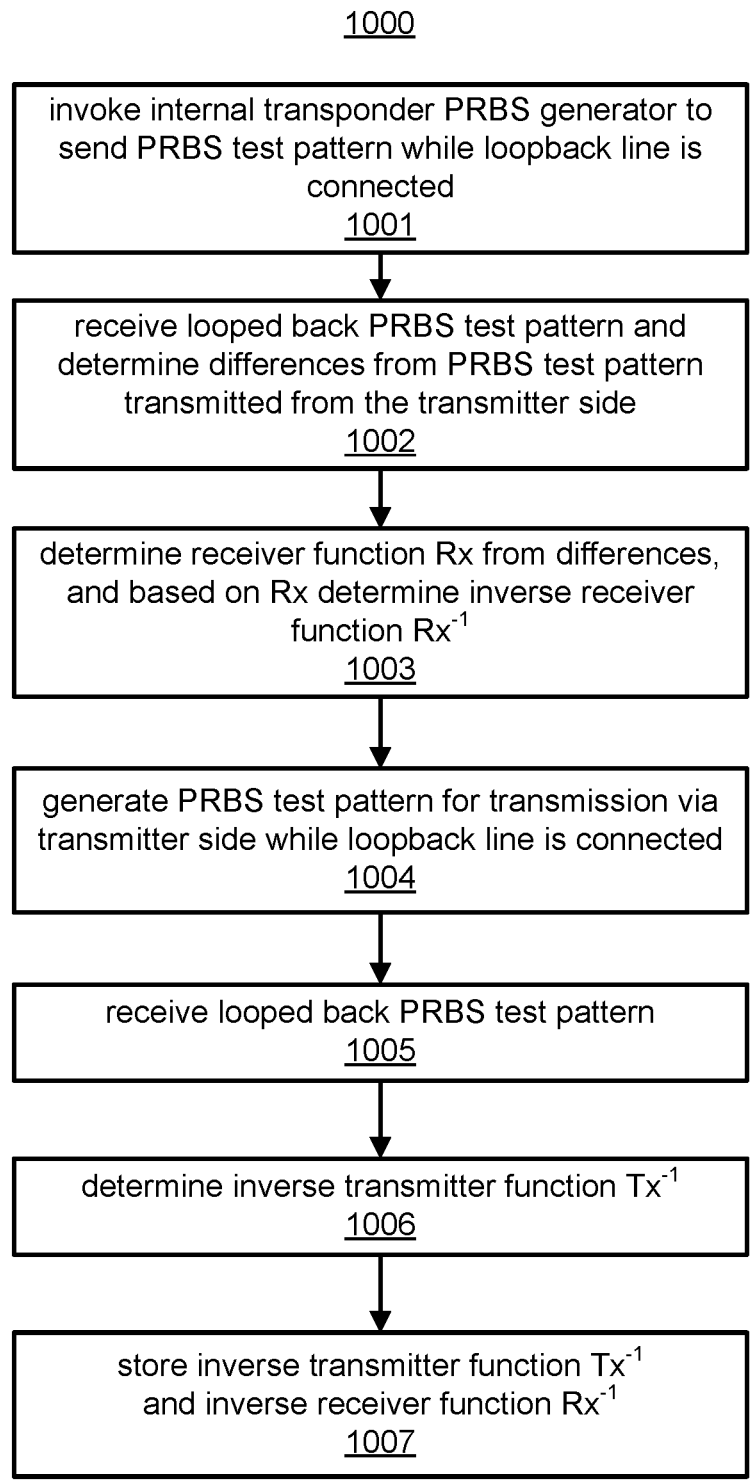
FIG. 10 illustrates a method, according to an example of the present disclosure.

FIG. 10 shows a method 1000 according to an example of the present disclosure. The method 1000 may be performed by a host device, such as the test instrument 100 or another host device. A host device is a device including hardware that can perform the operations of the method 1000. The method 1000 is described by way of example as being performed by the test instrument 100.

At 1001 and 1002 the Rx function and the inverse $Rx^{-1}$ function is determined as is further discussed below. At 1001, the controller 132 shown in FIG. 2 invokes the internal transponder PRBS generator 220 to send a PRBS test pattern while the loopback line 180 is connected to the Tx optics 230 and the Rx optics 231. The PRBS test pattern may be injected on each of the "n" lanes. The PRBS test pattern is not scrambled or delayed but is generated on the "n" lanes for transmission from the Tx optics 230, and is looped back via loopback line 180. The looped back PRBS test pattern is demultiplexed by the demultiplexer 211 and is scrambled and delayed according to the receiver function Rx. The generated PRBS test pattern which is looped back is a calibration signal to determine the receiver function Rx. The calibration signal is not required to be a PRBS test pattern and any known signal of sufficient pattern length nay be used.

At 1002, the signal analyzer 140 of the test instrument 100 receives the looped back PRBS test pattern to determine the differences from the PRBS test pattern transmitted from the transmitter side. For example, the controller 132 compares the received PRBS test pattern to what the PRBS test pattern should be, such as after going through a known multiplexing operation for a 1-to-5 multiplexer (e.g., round robin placement of bits on each of the 5 lanes with zero relative bit skew). Then matrices may be generated such as shown in FIGS. 7-8 to illustrate the delay and bit positions. From the differences and matrices, at 1003, the controller 132 determines the receiver function Rx, and based on the receiver function Rx, determines the inverse receiver function $Rx^{-1}$. For example, the controller 132 determines the scrambled bit sequence and delays (e.g., as shown at 620 of FIG. 6) when compared to the initial sequence to determine the receiver function Rx. The inverse of the receiver function Rx is calculated to determine the inverse receiver function $Rx^{-1}$ (e.g., 1/Rx). For example, combined functions ($Z^{-1}*P^{-1}$) whereby examples of $Z^{-1}$ and $P^{-1}$ are shown in FIG. 7. Also, as discussed above, alignment markers may be used to determine the receiver function instead of the looped test pattern.

At 1004, the test signal generator 120 generates a PRBS test pattern for transmission via the transmitter side while the loopback line 180 is connected. For example, the PRBS test pattern is transmitted to the transponder 150 from the test instrument 100. The transponder 150 multiplexes the PRBS test pattern, and as a result of the internal operations of the transponder 150 on the transmitter side, the PRBS test pattern is scrambled and delayed according to the transmitter function Tx. The PRBS test pattern is looped back, and is further scrambled according to the Rx function of the transponder 150, and is eventually received at the test instrument 100 at 1005. The PRBS test pattern received at 1005 is therefore modified by (Tx*Rx).

At 1006, the inverse transmitter function $Tx^{-1}$ is determined based on the PRBS test pattern received at 1005 and the Rx function determined at 1003. For example, the delay and bit scrambling from both the transmitter function Tx and the receiver function Rx is determined by comparing the PRBS pattern generated at 1004 to the looped back PRBS pattern received at the host at 1005, which is equal to Tx*Rx. From, Tx*Rx, the inverse is determined, which is 1/(Tx*Rx). Then, the inverse transmitter function $Tx^{-1}$ may be calculated based on 1/(Tx*Rx) and Rx determined at 1003 as follows: 1/(Tx*Rx)*Rx=1/Tx=$Tx^{-1}$, whereby $Tx^{-1}$ is the inverse transmitter function $Tx^{-1}$. The inverse transmitter function $Tx^{-1}$ determined at 1006, for example, includes a transmission bit sequence and delay to counteract delay and bit scrambling caused by the transponder. An example of the determined transmission bit sequence for the inverse transmitter function $Tx^{-1}$ is shown at 802 and 803 of FIG. 8, and an example of the determined delay is shown at 804 and 805 of FIG. 8.

At 1007, the determined inverse transmitter function $Tx^{-1}$ and the determined inverse receiver function $Rx^{-1}$ are stored for example in the data storage 141, such as shown in FIG. 2. The inverse transmitter function $Tx^{-1}$ which may be stored in the data storage, includes the mapping of each bit of a sequence of bits to a particular lane of multiple lanes which may carry the bits in parallel. Also, inverse transmitter function $Tx^{-1}$ may include the delay of each bit on each lane. Then, the circuit components shown in FIG. 3 may apply the inverse transmitter function $Tx^{-1}$ or the inverse receiver function $Rx^{-1}$ as is discussed with respect to FIGS. 6-8 and with respect to other figures discussed above. Once the inverse transmitter function $Tx^{-1}$ and the inverse receiver function $Rx^{-1}$ are determined, they can be used to transmit FEC codes, test patterns for testing the transponder or to transmit and type of data, such that the receiver receiving the data will receive the data unaffected by the bit skew and bit scrambling (transmitter function and/or receiver function) caused by the transponder.

While examples are disclosed herein, many variations are possible which remain within the concept and scope of the invention. Such variations would become clear to one of ordinary skill in the art after inspection of the specification, drawings, and claims herein. This invention therefore is not to be restricted except within the spirt and scope of the appended claims.

I claim:

1. A device, comprising:
an interface connectable to a transponder interface;
a controller to:
determine an inverse transmitter function to counteract at least one of bit skew or bit scrambling caused by a transponder communicatively coupled to the device,
wherein to determine the inverse transmitter function, the controller invokes transmission of a test pattern to the transponder via the interface, and receives the test pattern looped back from the transponder, wherein the received looped back test pattern is scrambled and delayed by the transponder; and
a circuit to:
receive bits of forward error correction (FEC) codes, and
scramble and control delay of the bits of the FEC codes based on the inverse transmitter function; and
transmit the scrambled and control-delayed bits of the FEC codes to the transponder via the interface for transmission on an optical line connectable to an optical interface of the transponder.

2. The device of claim 1, wherein the inverse transmitter function comprises adjustments to bit skew and transmission bit sequence to counteract bit skew and bit scrambling caused by the transponder.

3. The device of claim 1, wherein to determine the inverse transmitter function, the controller is to:
use a known test pattern or use alignment markers to determine a transmitter function of the transponder; and
determine the inverse transmitter function based on the transmitter function.

4. The device of claim 1,
wherein prior to transmitting the scrambled and delayed bits of the FEC codes to the transponder:
to scramble the bits of the FEC codes, the circuit is to map each of the bits to a lane of "m" number of lanes based on the inverse transmitter function; and
to control the delay of the bits of the FEC codes, the circuit is to delay at least one of the bits on its lane based on the inverse transmitter function.

5. The device of claim 4, wherein the transponder multiplexes the bits on the "m" number of lanes to "n" number of lanes, wherein "n" and "m" are integers and "n" is less than "m.

6. The device of claim 4, wherein:
the controller is to:
determine an inverse receiver function to counteract bit skew and bit scrambling caused by the transponder, the transponder transmitting second FEC codes; and
the circuit is to:
receive bits of the second FEC codes, wherein the bits are scrambled and delayed by the transponder; and
scramble and control delay of the received bits of the second FEC codes based on the inverse receiver function.

7. The device of claim 6, wherein the scrambled and delayed bits of the second FEC codes have a sequence corresponding to an initial sequence of bits in the second FEC codes received at the optical interface of the transponder.

8. The device of claim 7, wherein the scrambled and delayed bits of the second FEC codes correspond to a FEC codeword initially received at the optical interface of the transponder.

9. The device of claim 7, wherein the scrambled and delayed bits of the second FEC codes are transmitted as a FEC codeword to a FEC application to perform error correction based on the FEC codeword.

10. The device of claim 6, wherein to determine the received bit sequence and delay, the controller is to:
invoke a test pattern having a known sequence of bits to be transmitted from the optical interface of the transponder without being multiplexed by the transponder, wherein the test pattern is looped back to the optical interface, and the looped back test pattern is scrambled and delayed by the transponder as the transponder sends the looped back test pattern to the device;
determine the transmission bit sequence and delay by comparing the scrambled and delayed test pattern to the test pattern transmitted from the optical interface;
transmit a second test pattern having a known sequence of bits to the transponder to output via the optical interface, wherein the second test pattern is looped back to the optical interface, and the looped back second test pattern is scrambled and delayed by the transponder as the transponder sends the looped back second test pattern to the device;
determine scrambling and delay of the second pattern caused by a receiving and transmitting side of the transponder; and
determine the received bit sequence and delay based on the determined scrambling and delay of the second pattern and the transmission bit sequence and delay.

11. The device of claim 1, wherein the circuit comprises:
a switch to scramble the bits FEC codes based on the transmission bit sequence; and
a delay generator to increase or decrease delay of at least one of the bits of the FEC codes based on the transmission delay.

12. A method, comprising:
generating, by a processor of a test instrument connectable to an optoelectronic transponder, a test pattern, wherein the test pattern is a pseudorandom binary sequence (PRBS)-based test pattern;
transmitting the test pattern to the transponder via an electrical interface, wherein the transponder is to transmit the test pattern from an optical interface of the transponder, and the transmitted test pattern is looped back to the optical interface, and the looped back test pattern is transmitted to the test instrument via the electrical interface;
receiving, by the processor, bits of the looped back test pattern;

scrambling and controlling delay of the bits to counteract any scrambling and delay of the transmitted test pattern and the looped back test pattern caused by the transponder;

receiving, by the processor, the receive bits of the looped back test pattern from the circuit; and measuring, by the processor, at least one performance metric based on the looped back test pattern.

13. The method of claim 12, further comprising:

applying, prior to transmitting the test pattern to the transponder, an inverse transmitter function to scramble and delay bits of the test pattern to counteract scrambling and delay caused by a transmitter side of the transponder.

14. The method of claim 12, further comprising:

applying, by the processor, an inverse receiver function to scramble and delay bits of the looped back test pattern to counteract scrambling and delay caused by a receiver side of the transponder.

15. The method of claim 12, wherein the at least one performance metric comprises a bit error rate (BER).

16. A non-transitory computer-readable storage medium having an executable stored thereon, which when executed instructs a processor to:

generate a test pattern at a test instrument connectable to an optoelectronic transponder, wherein the test pattern is a pseudorandom binary sequence (PRBS)-based test pattern;

transmit the test pattern to the transponder via an electrical interface, wherein the transponder is to transmit the test pattern from an optical interface of the transponder, and the transmitted test pattern is looped back to the optical interface, and the looped back test pattern is transmitted to the test instrument via the electrical interface;

receive bits of the looped back test pattern;

scramble and controlling delay of the bits to counteract any scrambling and delay of the transmitted test pattern and the looped back test pattern caused by the transponder; and receive the receive bits of the looped back test pattern from the circuit.

17. The non-transitory computer-readable storage medium of claim 16, further comprising:

apply, prior to transmitting the test pattern to the transponder, an inverse transmitter function to scramble and delay bits of the test pattern to counteract scrambling and delay caused by a transmitter side of the transponder.

18. The non-transitory computer-readable storage medium of claim 16, further comprising:

apply an inverse receiver function to scramble and delay bits of the looped back test pattern to counteract scrambling and delay caused by a receiver side of the transponder.

19. The non-transitory computer-readable storage medium of claim 16, further comprising:

measure at least one performance metric based on the looped back test pattern.

20. The non-transitory computer-readable storage medium of claim 19, wherein the at least one performance metric comprises a bit error rate (BER).

* * * * *